US006578169B1

United States Patent
Le et al.

(10) Patent No.: US 6,578,169 B1
(45) Date of Patent: Jun. 10, 2003

(54) DATA FAILURE MEMORY COMPACTION FOR SEMICONDUCTOR TEST SYSTEM

(75) Inventors: Anthony Le, Santa Clara, CA (US); Rochit Rajsuman, Santa Clara, CA (US); James Alan Turnquist, Santa Clara, CA (US); Shigeru Sugamori, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/545,730

(22) Filed: Apr. 8, 2000

(51) Int. Cl.[7] .............................................. G01R 31/28
(52) U.S. Cl. ...................................... 714/736; 714/723
(58) Field of Search ................................ 714/718, 722, 714/724, 736, 738, 719, 723, 743

(56) References Cited

U.S. PATENT DOCUMENTS

| 5,610,925 | A | * | 3/1997 | Takahashi | 324/73.1 |
| 5,717,670 | A | * | 2/1998 | Mitsuno | 369/59.26 |
| 5,854,796 | A | * | 12/1998 | Sato | 714/718 |
| 5,991,898 | A | * | 11/1999 | Rajski et al. | 714/30 |
| 6,041,429 | A | * | 3/2000 | Koenemann | 714/726 |
| 6,067,651 | A | * | 5/2000 | Rohrbaugh et al. | 714/726 |

OTHER PUBLICATIONS

"Evaluation of Effective Throughput Rate for Certain ATE Architectures with Data Compaction/Decompaction"—Campbell et al IEEE Transactions on Instrumentation and Measurement, vol.: 37 Issue: 1 pp.: 70–75 Mar. 1988.*

* cited by examiner

Primary Examiner—Albert Decady
Assistant Examiner—Cynthia Britt
(74) Attorney, Agent, or Firm—Muramatsu & Associates (57) ABSTRACT

A semiconductor test system for testing a semiconductor device under test (DUT) is able to store failure data in a data failure memory with small memory capacity. The semiconductor test system includes a pattern memory for storing pattern data therein to produce a test pattern to be supplied to the DUT, means for evaluating an output signal of the DUT and producing failure data when there is a fail therein, a data failure memory for storing the failure data, and compaction means for assigning a plurality of addresses of the pattern memory to a single address of the data failure memory in a first test operation so that failure data occurred for each group of addresses of the pattern memory is stored in a corresponding address of the data failure memory, and for executing a second test operation for only a group of addresses of the pattern memory in which the failure data is detected without an address compaction.

9 Claims, 8 Drawing Sheets

DATA FAILURE MEMORY COMPACTION FOR SEMICONDUCTOR TEST SYSTEM

FIELD OF THE INVENTION

This invention relates to a semiconductor test system for testing semiconductor devices, and more particularly, to a semiconductor test system incorporating a method and structure for storing test results in a data failure memory in a manner which is able to substantially decrease the capacity of the data failure memory without decreasing any information on the test results.

BACKGROUND OF THE INVENTION

In testing semiconductor devices such as ICs and LSIs by a semiconductor test system, such as an IC tester, a semiconductor IC device to be tested is provided with test signals or test patterns produced by an IC tester at its appropriate pins at predetermined test timings. The IC tester receives output signals from the IC device under test in response to the test signals. The output signals are strobed or sampled by strobe signals with predetermined timings to be compared with predetermined threshold voltages and further compared with expected data to determine whether the IC device functions correctly.

Traditionally, timings of the test signals and strobe signals are defined relative to a tester rate or a tester cycle of the semiconductor test system. Such a test system is sometimes called a cycle based test system where test data for producing test signals and strobe signals includes waveform data, timing data and vector, which are defined relative to each test cycle. Although the cycle based test system can save the memory capacity in the test system, the test data description and assignment of test data to test pins are complicated, resulting in requiring complicated hardware and software.

Another type of test system is called an event based test system wherein the desired test signals and strobe signals are produced wherein the desired test signals and strobe signals are produced by event data from an event memory directly on a per pin basis. In an event based test system, notion of event is employed, which is any change of the logic state in signals to be used for testing a semiconductor device under test. For example, such changes are rising and falling edges of test signals or timing edges of strobe signals. Although the event based test system may need larger capacity of data memory therein, it is considered that data description and processing of the data is much simpler than that of the cycle based test system. Thus, the event based test system is more suited for the future test system of a per-pin architecture where each pin is freely assignable and independently operable.

The present invention is advantageously applicable to the event based test system and described mainly with respect to the event based test system in the following. However, it should be noted that the present invention is not limited to the event based tester but the basic concept of which is applicable to any types of semiconductor test system.

Figure 1:
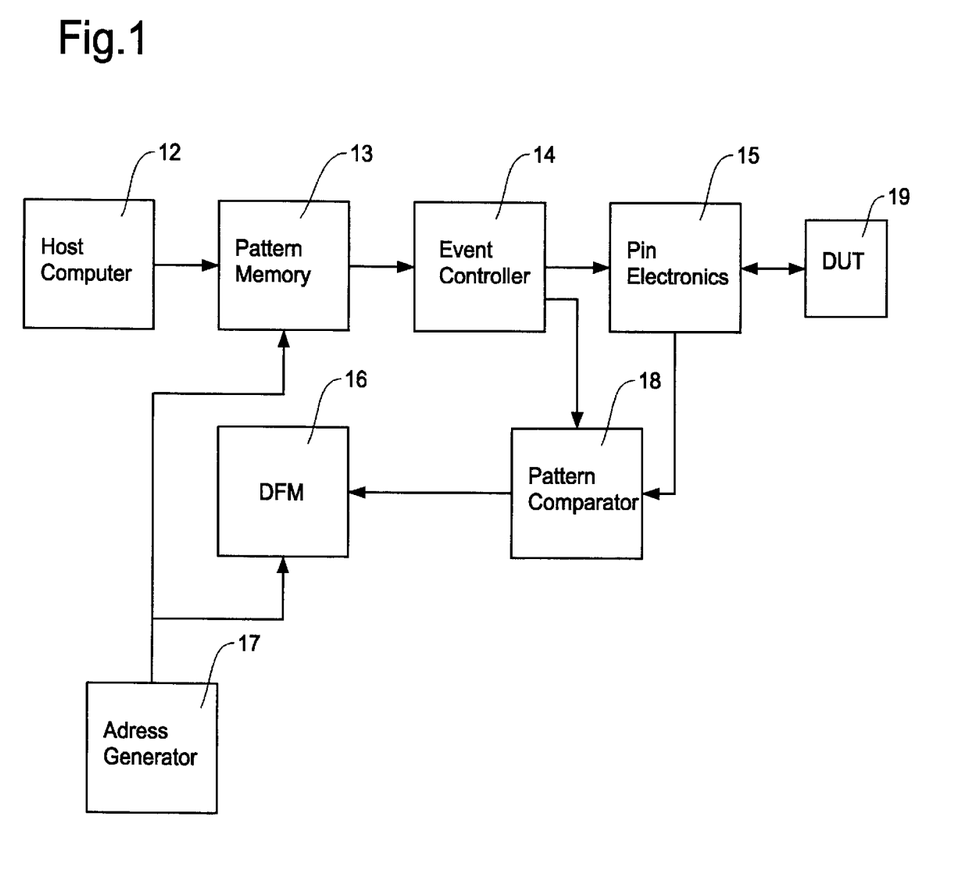
FIG. 1 is a block diagram showing a basic structure of a semiconductor test system including a pattern memory and a data failure memory.

FIG. 1 is a schematic diagram showing a basic structure of a semiconductor test system. This basic structure is basically the same in both the cycle based test system and event based test system noted above. The test system of FIG. 1 includes a host computer 12, a pattern memory 13, an event controller (wave formatter) 14, a pin electronics 15, a data failure memory (DFM) 16, an address generator 17 and a pattern comparator 18. The semiconductor test system of FIG. 1 is to evaluate a semiconductor device under test (DUT) 19, which is typically a memory IC such as a random access memory (RAM) and a flash memory, a logic IC such as a microprocessor and a digital signal processor, or a system IC such as a system-on-a-chip IC, connected to the pin electronics 15.

An example of the host computer 12 is a work station having a UNIX operating system therein. The host computer 12 functions as a user interface to enable a user to instruct the start and stop operation of the test, to load a test program and various test conditions, or to perform test result analysis. The host computer 12 interfaces with a hardware test system through a system bus (not shown).

The pattern memory 13 stores pattern data such as event timing data and event type data for generating test signals (test patterns) and strobe signals. The data failure memory (DFM) 16 is to store test result such as failure data of the DUT 19 from the pattern comparator 18. The address generator 17 provides address data to access the pattern memory 13 and the DFM 16 during the test operation.

The event controller 14 receives the pattern data from the pattern memory 13 to produce test signals and strobe signals based on the events reproduced by the pattern data. The test signals and strobe signals thus generated are provided to the DUT 19 through the pin electronics 15. Basically, the pin electronics 15 is formed of a large number of components, each of which includes a driver and an analog comparator as well as switches to establish input and output relationships with respect to the DUT 19.

A response signal from the DUT 19 resulted from the test pattern is converted to a logic signal by an analog comparator within the pin electronics 15 with reference to predetermined threshold voltage levels. The resultant logic signal (DUT output data) is compared with expected output data from the event controller 14 by the pattern comparator 18. Upon detecting a mismatch between the DUT output data and the expected output data, an error indication is stored in the DFM (data failure memory) 16 corresponding to the address of the pattern memory 14. The error data (failure data) could represent the actual value of the device output pin at the strobe point, or it could be just a single bit indicating pass or fail.

The test engineers and design engineers use the failure data in the DFM 16 to analyze correctness of the device design and functions. Typically, the capacity of the DFM 16 is the same as that of the pattern memory 13. The pattern memory 13 and the DFM 16 are accessed by the same address data from the address generator 17 during the device testing stage. Thus, in the failure analysis stage after the device testing, scanning for failure data in the DFM 16 yields the location of the pattern data (test signals) in the pattern memory 13 causing the failure in the DUT output.

Figure 2:
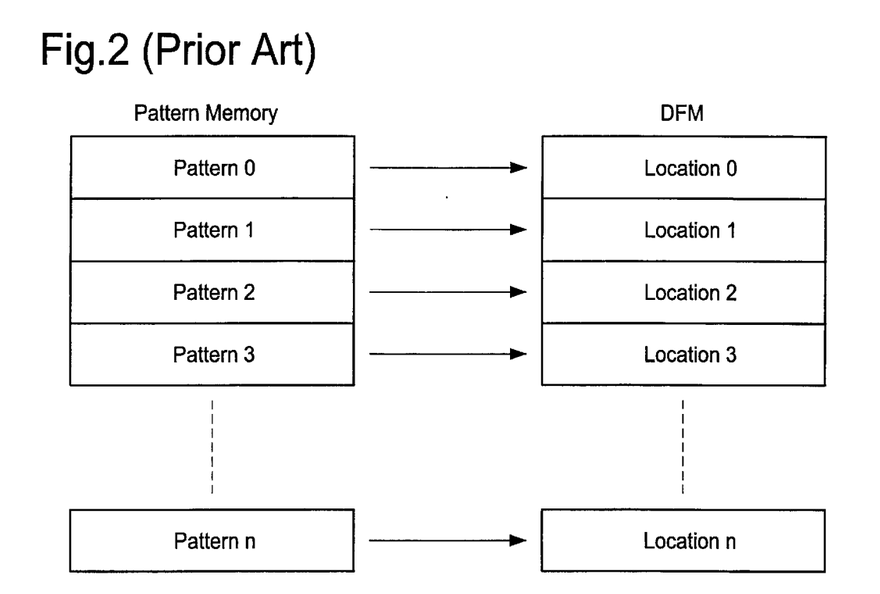
FIG. 2 is a block diagram showing a relationship between the pattern memory and the data failure memory in the conventional technology.

FIG. 2 shows such a one-to-one relationship between the pattern memory 13 and the DFM (data failure memory) 16. For example, if a failure is detected at the "location 2" in the DFM 16, it indicates that the "pattern 2" in the pattern memory produces the failure. Thus, the pattern memory 13 and the DFM are in the one-to-one correspondence in the memory locations. This system configuration in the conventional technology is costly because it requires the same memory capacity of the DFM as that of the pattern memory.

Figure 3:
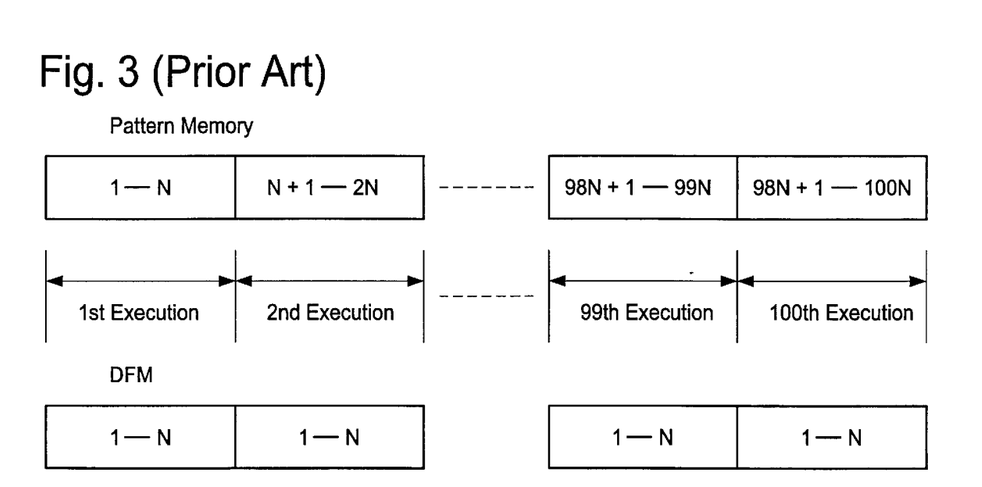
FIG. 3 is a block diagram showing an example of operation of the pattern memory and data failure memory in the conventional technology when using the data failure memory of reduced memory capacity.

An example of conventional solution of this problem is shown in a schematic diagram of FIG. 3. In this example, the test system uses a data failure memory (DFM) having a capacity much smaller than that of the pattern memory. When the test pattern is longer than the capacity of the DFM, the test pattern from the pattern memory has to be divided into a plurality of smaller blocks so that each test pattern block is the same or smaller size than the capacity of the DFM. In FIG. 3, since the DFM has a capacity of N locations (addresses), a plurality of blocks of the test pattern, each corresponding to the N locations of the pattern memory, have to be generated separately.

Namely, in the first execution of the test program, test pattern from the pattern memory locations 1-N is generated while the DFM gathers the test results in the 1-N memory locations. If there is a failure detected in the DFM, failure analysis may be performed. If there is no failure, the test proceeds to the next block of test pattern corresponding to N memory locations. Thus, in the second execution of the test program, the test pattern from N+1 to 2 N is generated while the DFM collects the test results in the 1-N locations. In this manner, for each execution of the test program, the DFM address is mapped to N locations of the pattern memory. It is clear that this conventional solution is disadvantageous in that it increases time to test semiconductor device especially when failure memory analysis is required.

SUMMARY OF THE INVENTION

Therefore, it is an object of the present invention to provide a semiconductor test system having means for storing failure information of the semiconductor device under test in a data failure memory (DFM) having a memory capacity substantially smaller than that of a pattern memory.

It is another object of the present invention to provide a semiconductor test system which is capable of storing failure data regarding the semiconductor device under test in a predetermined compaction ratio in the first test run, searching the failure data, and conducting the second test run without compaction for only a specified range of test pattern corresponding to failure data detected in the data failure memory in the first test run.

It is a further object of the present invention to provide a semiconductor test system which is capable of storing failure data regarding the semiconductor device under test in a predetermined compaction ratio with respect to a number of events produced by the pattern data from the pattern memory.

It is a further object of the present invention to provide a semiconductor test system which is capable of storing failure data regarding the semiconductor device under test in a predetermined compaction ratio with respect to a time length of test pattern produced by the pattern data from the pattern memory.

The present invention is a semiconductor test system incorporating a structure and method for compacting a data failure memory (DFM) for capturing failure data therein when testing a semiconductor device under test (DUT) by providing a test signal to the DUT and evaluating an output of the DUT at a timing of a strobe signal. When the output data of the DUT does not match the expected data, failure data is stored in the DFM. By using a unique compaction method, the size of the DFM can be much smaller than the capacity of a pattern memory storing the pattern data to produce the test signals.

In the present invention, the semiconductor test system includes a pattern memory for storing pattern data therein to produce a test pattern to be supplied to the DUT for testing the DUT, means for evaluating an output signal of the DUT by comparing the output signal with an expected signal and producing failure data when there is a mismatch therebetween, a data failure memory for storing the failure data caused by the mismatch between the output signal and the expected signal, and compaction means for assigning a plurality of addresses of the pattern memory to a single address of the data failure memory in a first test operation so that failure data occurred for each group of plurality of addresses of the pattern memory is stored in a corresponding address of the data failure memory in a predetermined compaction ratio and for executing a second test operation for only a group of plurality of addresses of the pattern memory in which the failure data is detected in the data failure memory without an address compaction between the pattern memory and the data failure memory.

In one aspect of the present invention, the compaction ratio between the pattern memory and the data failure memory is determined by a number of events generated by the pattern data from the pattern memory and an address of the data failure memory. Means is provided to count the number of events generated by the test system while accumulating failure data during that period. When the number of events reaches an amount specified by a compaction ratio, the accumulated failure data is transferred to the data failure memory and stored in a specified location.

In another aspect of the present invention, the compaction ratio between the pattern memory and the data failure memory is determined by a time length of the test pattern produced by the pattern data from the pattern memory and an address of the data failure memory. Means is provided to measure a time length of the test pattern generated based on the pattern data from the pattern memory while accumulating failure data during that period. When the time length of the test pattern reaches an amount specified by a compaction ratio, the accumulated failure data is transferred to the data failure memory and stored in a specified location.

According to the present invention, the semiconductor test system is capable of collecting the failure information of the device under test in the data failure memory (DFM) of small capacity by using the compaction method. In one aspect, the failure data is captured in the DFM in an event compaction method in which a specified number of events produced by the pattern data from the pattern memory is assigned to a single address of the DFM. In another aspect, the failure data is captured in the DFM in a time compaction method in which a specified time length of test pattern produced by the pattern data from the pattern memory is assigned to a single address of the DFM. In the case where a failure is detected in the compaction mode, a second test is performed for the range of test pattern, either in the number of test pattern or the time length of the pattern, with no compaction, i.e., compaction ratio "1", so that the test system can capture the failure data in a one-to-one relationship with a test signal

BRIEF DESCRIPTION OF THE DRAWINGS

FIGS. 4A and 4B are block diagrams showing an example of relationship between the pattern memory and data failure memory in the first embodiment of the present invention using an event compaction method. FIG. 4A shows a relationship therebetween in the first test operation, and FIG. 4B shows a relationship therebetween in the second operation of the test system.

FIGS. 7A and 7B are block diagrams showing an example of relationship between the pattern memory and data failure memory in the second embodiment of the present invention using a time compaction method. FIG. 7A shows a relationship therebetween in the first test operation, and FIG. 7B shows a relationship therebetween in the second operation of the test system.

DETAILED DESCRIPTION OF THE PREFERRED EMBODIMENTS

Figure 4A:
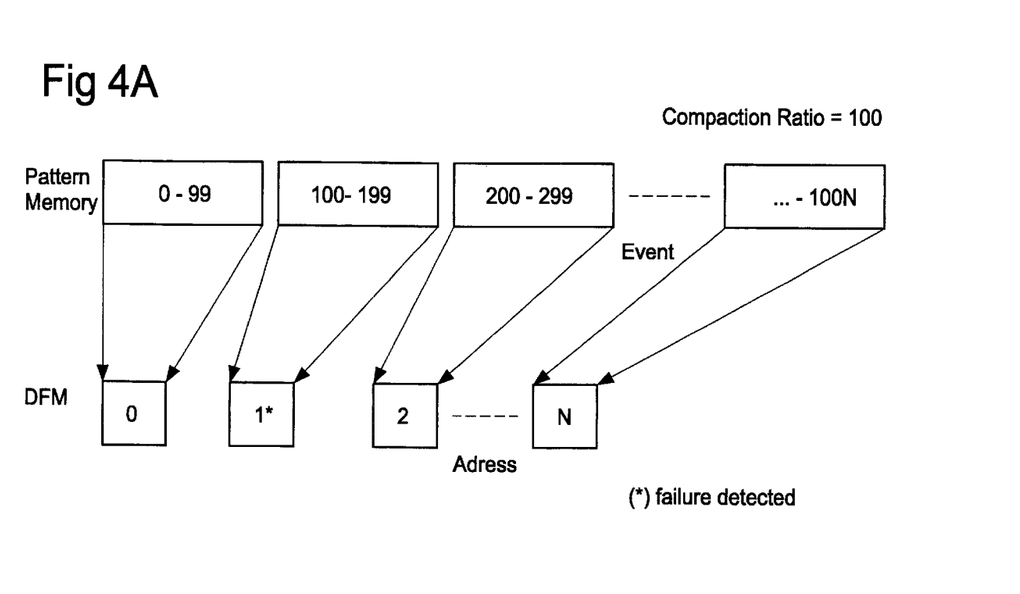
Figure 4B:
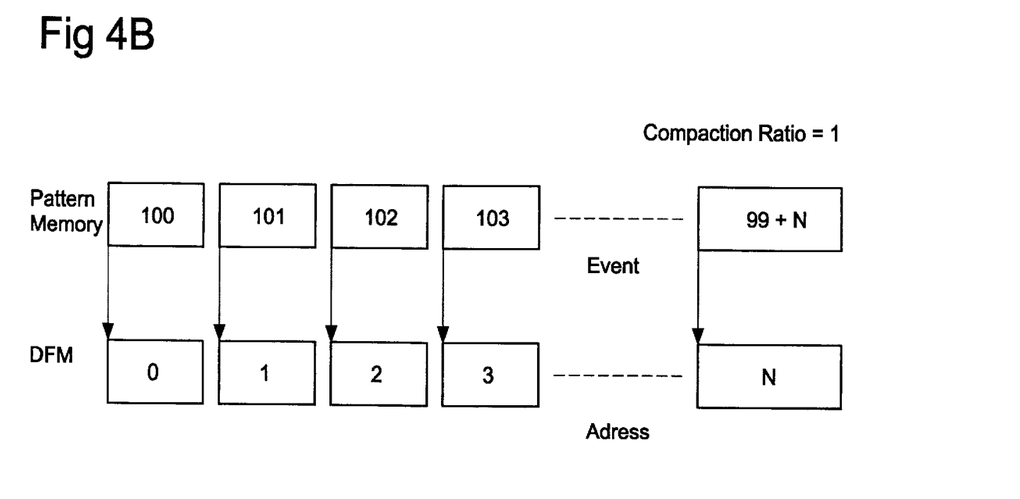

FIGS. 4A and 4B are block diagrams showing the first embodiment of the present invention which is directed to an event compaction method. FIG. 4A shows an example of relationship between the pattern memory and the data failure memory (DFM) in the first test operation, and FIG. 4B shows a relationship between the pattern memory and the DFM in the second operation of the test system.

In the first embodiment, data compaction is achieved with reference to numbers of events (edges of the test pattern) generated by the test system. Such events are generated based on the pattern data in the pattern memory. In the example of FIG. 4A, failure information corresponding to every hundred (100) events is accumulated in a single location of the DFM in the first test operation. Thus, a compaction ratio in this example is "100". In the second test operation of FIG. 4B, only the region of 100 events which being indicated that a failure is detected in the DFM in the first test operation is again examined with no compaction.

More particularly, in FIG. 4A, a memory location (address) "1" of the DFM is assigned to failure data detected during the events 1–99, a memory location "2" of the DFM is assigned to failure data corresponding to events 100–199, and a memory location "3" of the DFM is assigned to the events 200–299, and so on. In this manner, any failures in each 100 events are stored as one failure in the single location of the DFM. Since this example shows a compaction ratio of 100, a memory size of 100 times smaller than that of the pattern memory can be used as the DFM.

In this example, it is assumed that a failure is detected in the location "2" of the DFM in the first test operation. In this stage, since the failure data in the DFM merely indicates that there is a failure in the region of events 100–199, it is not known which particular event produces the failure. Therefore, to know the exact relationship between the failure and the event producing the failure, the second test operation is performed for the events 100–199 with no compaction, i.e., a compaction ratio "1", between the pattern memory and the DFM. Thus, for the 100 events from event 100 to event 199, the memory locations 1–100 of the DFM are assigned as shown in FIG. 4B in a one-to-one relationship, thereby detecting a failure for a particular event.

Figure 5:
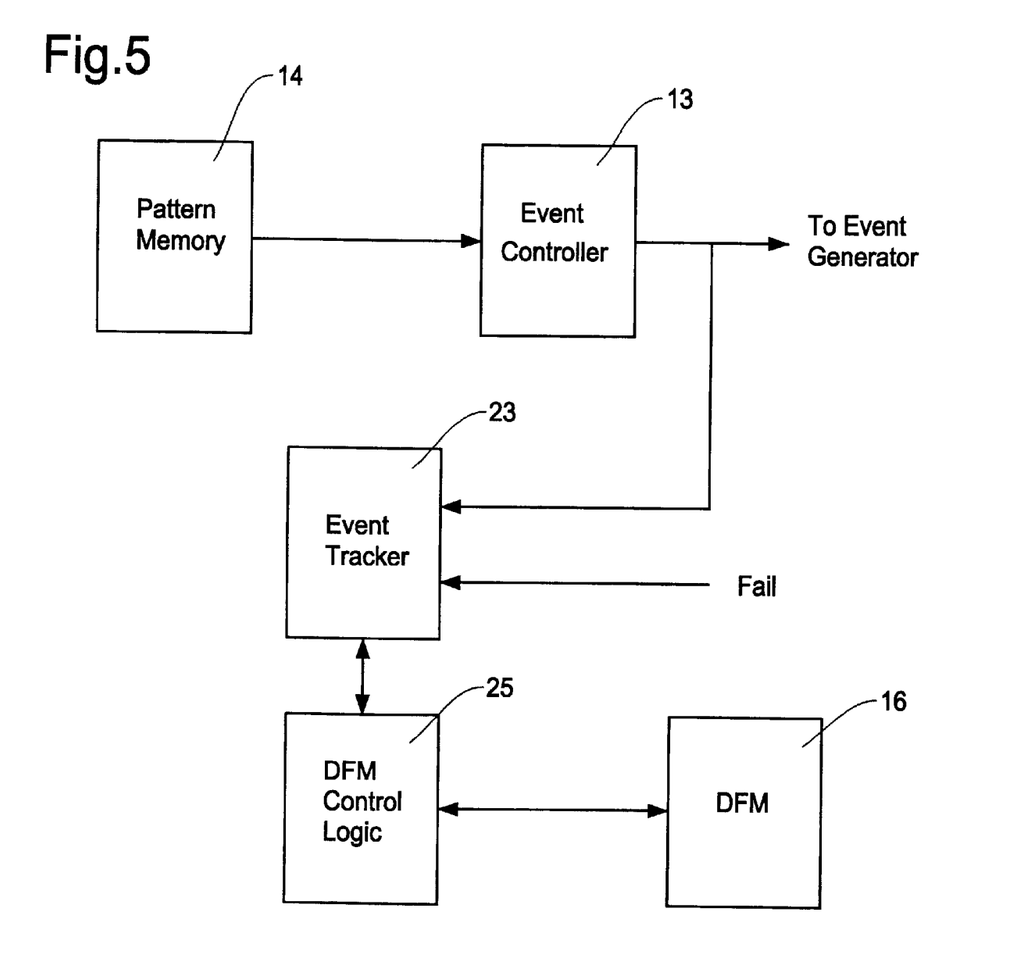
FIG. 5 is a block diagram showing an example of structure in the semiconductor test system of the present invention for collecting the failure data in a data failure memory of small memory capacity.

FIG. 5 shows an example of structure in the semiconductor test system shown in FIG. 5 to achieve the function described above. In this example, the semiconductor test system includes an event tracker 23 and a DFM (data failure memory) control logic 25 between the event controller 13 and the DFM 16. The event tracker 23 controls an overall operation for storing the failure data in the DFM. The event tracker detects the number of events received from the event controller 13. The DFM control logic 25 controls access of the DFM 16 based on the number of events detected and a specified compaction ratio under the control of the event tracker 23.

Figure 6:
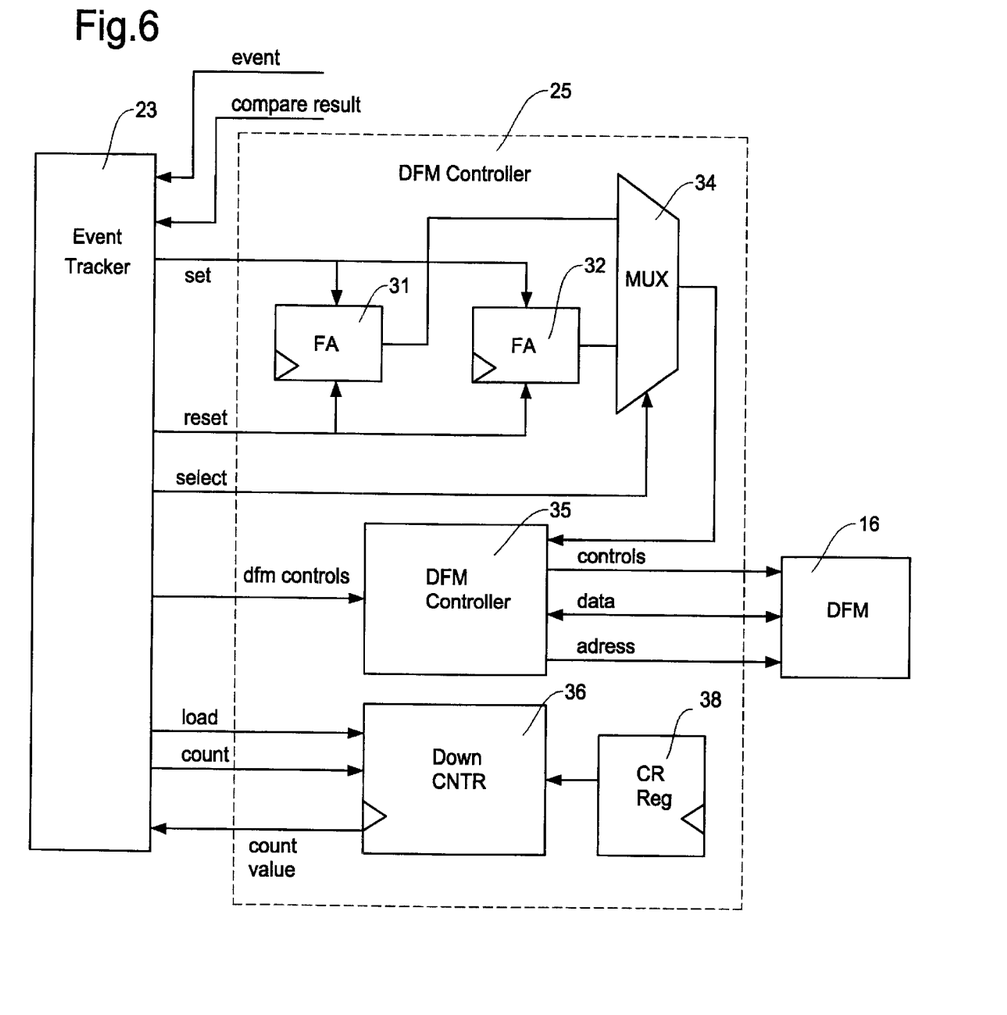
FIG. 6 is a block diagram showing an example of structure in the DFM (data failure memory) control logic and event tracker in the block diagram of FIG. 5 to be used in the semiconductor test system of the present invention.

FIG. 6 shows an example of more detailed structure in the DFM control logic 25 to be used in the first embodiment of the present invention. The event tracker 23 receives the event generated by the event controller 13 and controls the DFM control logic 25. The event tracker 23 also receives comparison results, such as fail data, from the pattern comparator 18. In this example, the DFM control logic 25 includes fail accumulators (FA) 31 and 32, a multiplexer 34, a DFM controller 35, a down counter 36, and a CR (compaction ratio) register 38. In this example, two fail accumulators (FA) 31 and 32 are used to alternately store (set) the fail data from the pattern comparator through the event tracker 23. The DFM control logic 25 controls access of the DFM 16 so that the fail data accumulated in the FA 31 and FA 32 is selectively stored in the DFM 16 when the counted number of events reaches the number specified by the compaction ratio in the CR register 38.

In the arrangement of FIG. 6, the CR register 38 provides a compaction ratio such as "100" of FIG. 4A to the down counter 36. The compaction ratio "100" is loaded in the down counter 36 by a load command from the event tracker 23 and down counts the preset value "100" by the event received through the event tracker 23. When the counted value of the down counter 36 reaches zero, i.e., 100 events are generated by the event controller 13 of FIGS. 1 or 5, the event tracker 23 sends a control signal to the DFM controller 35 so that the address data for the DFM increments by one. At the same time, the accumulated failure data in either the FA 31 or FA 32 through the multiplexer 34 is stored in the specified address of the DFM 16.

In this example, two failure accumulators 31 and 32 are used to accurately collect the failure data therein while transmitting the accumulated failure data to the DFM. Thus, in the case where such an operation can be satisfied by a single accumulator, only one accumulator is sufficient. When using the two failure accumulators FA as above, the event tracker 23 provides a select signal to the multiplexer 34 to select one of the failure accumulators FA to transfer the data to the DFM 16. The selected failure accumulator FA clears its content (reset) while the other failure accumulator FA accumulates the failure data (set) therein for another set of 100 events. By repeating this process, failure data is obtained in a specified compaction ratio such as "100" in the manner shown in FIG. 4A.

When a failure is detected in the DFM 16 with respect to the unit of 100 events such as in the second group of 100 events as shown in FIG. 4A after the first test operation, the second test operation is performed only on the second group of 100 events without compaction, i.e., compaction ratio "1", as shown in FIG. 4B. Thus, in the second test operation, the CR register 38 provides a compaction ratio "1" to the down counter 36, so that the address data for the DFM 16 increments at each event generation and the failure data is transferred to the DFM at each event generation. Thus, the failure data is stored in the DFM in the addresses thereof in the one-to-one relationship with the event generated by the test system.

The event compaction method in the foregoing is effective for the data pins (tester pins or test channels) that share the same number of events. As is known in the art, a semiconductor test system has a large number of data pins (tester pins or test channels) such as several hundred pins to test a semiconductor device having a large number of device pins. Each data pins has a configuration such as shown in FIG. 1 so that each data pin can provide a test pattern to the corresponding device pin. Since test patterns to be applied to the device pins are not always the same, the number of events among the data pins can be different. In such a situation, the event compaction method noted above may involve errors in collecting the failure data in the DFM.

Therefore, the second embodiment of the present invention is made to solve the problem associated in the event compaction method in the first embodiment. The second embodiment is directed to a time compaction method where a test pattern is divided into a plurality of groups each having the same specified time length. One common parameter among data pins is the test time. Regardless of a number of events of each data pin, all data pins that belong to the same group, start and stop at the same time. Thus, in the time compaction method of the present invention, failure data during a specified time length of the test pattern is assigned to a single memory location of the DFM in the first test operation. Then, in the second test operation, only the time length of test pattern which has caused the failure data stored in the DFM is tested again with no compaction in the second test operation.

Figure 7A:
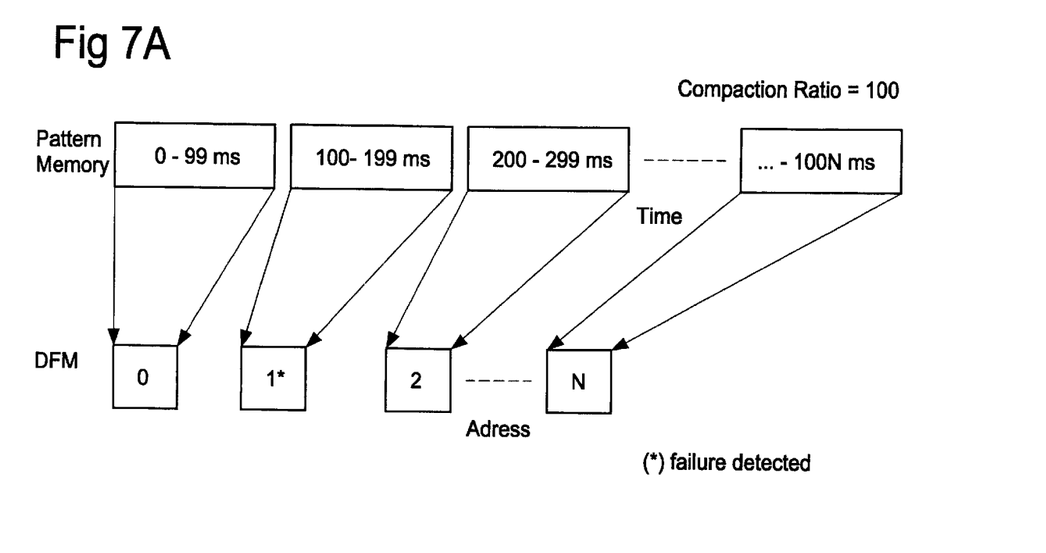
Figure 7B:
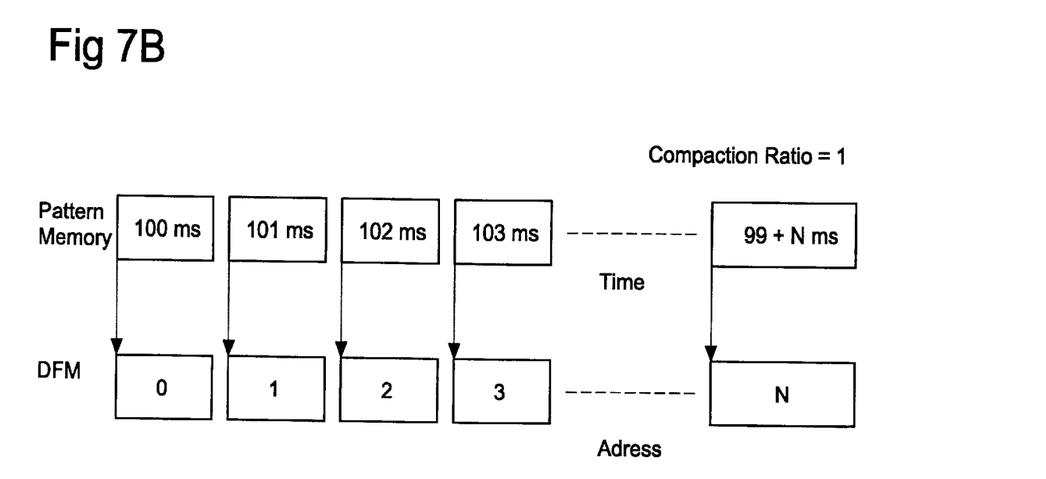

This example is shown in FIGS. 7A and 7B which are similar to the example of FIGS. 4A and 4B. In FIGS. 7A and 7B, instead of number of events, a time length of the test pattern is divided into a plurality of groups, each having the same time length. For example, in FIG. 7A, the test pattern from the pattern memory is separated into several test patterns, each of which has 100 millisecond (ms) in the pattern time length. Each test pattern of 100 ms is assigned to a single location (address) of the DFM.

Therefore, in the first test operation, failure data for each 100 ms test pattern is stored in the assigned location (address) of the DFM 16. For example, failure data detected during 0–99 ms of the test pattern is stored in the location "0", failure data detected during 100–199 ms of the test pattern is stored in the location "1", failure data detected during 200–299 ms of the test pattern is stored in the location "2", and so on. By repeating this process, failure data for overall pattern length is stored in the DFM in the first test operation.

If there is detected failure data in any locations of the DFM, only the test pattern length corresponding to the failure data is executed again without compaction in the second test operation. FIG. 7B shows a relationship between the time length of the test pattern and the addresses of the DFM. In this example, each address of the DFM is assigned to a 1 ms pattern length, i.e., no compaction or a compaction ratio "1". Thus, more precise failure analysis can be conducted by studying the failure data obtained in the second test operation.

Figure 8:
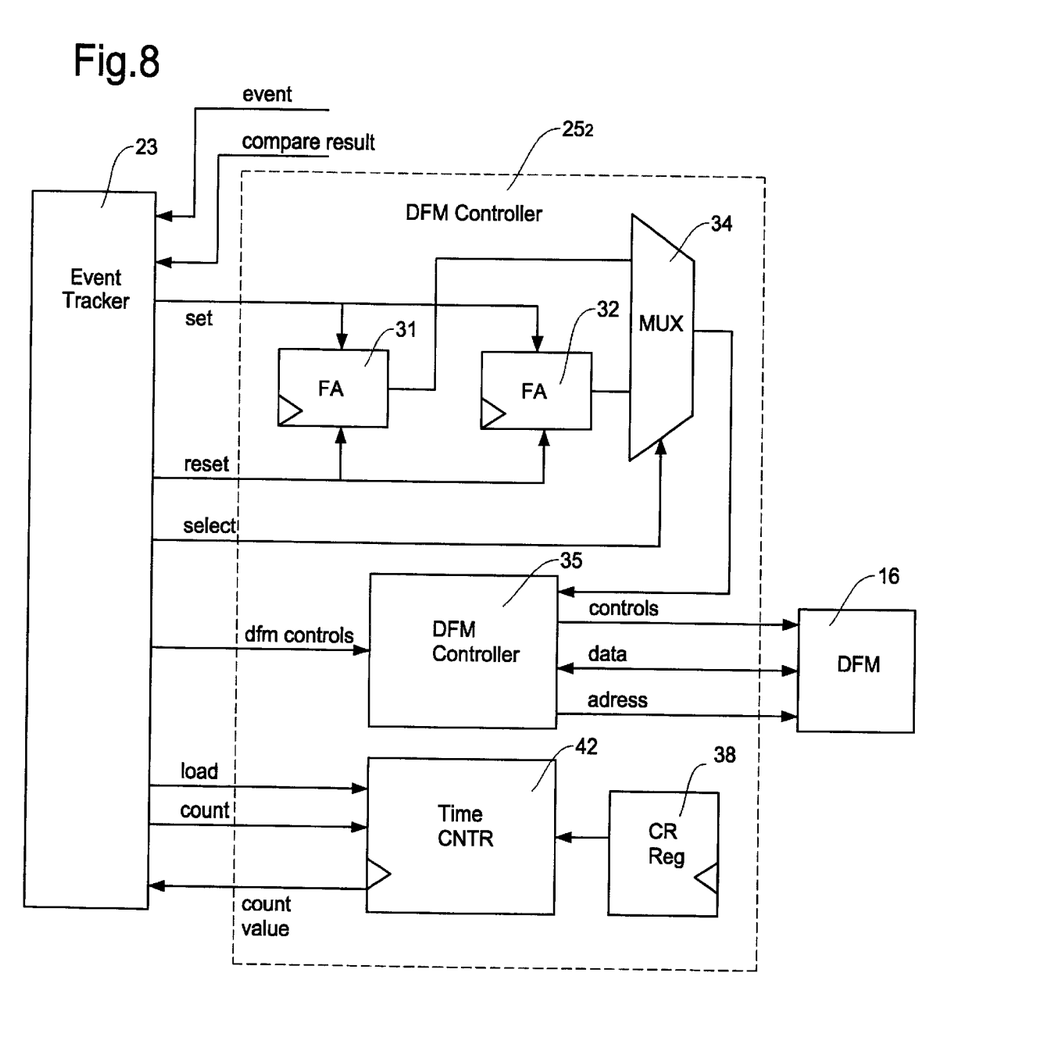
FIG. 8 is a block diagram showing an example of structure in the DFM (data failure memory) control logic and event tracker to be used in the second embodiment of the semiconductor test system of the present invention.

FIG. 8 shows an example of more detailed structure in the DFM control logic $25_2$ to be used in the second embodiment of the present invention. The configuration of FIG. 8 is almost the same as that of FIG. 6 with the exception of a time counter 42. Namely, instead of the down counter 36 in FIG. 6, the time counter 42 is provided to measure the time length of the test pattern. The event tracker 23 controls the overall operation in storing the failure data in the DFM in the first and second test operations.

The CR register 38 provides a compaction ratio to the time counter 42 which measures a time length of the test pattern by counting clock pulses. When reaching a time length specified by the compaction ratio by monitoring the count value of the time counter 42, the event tracker 23 sends a control signal to the DFM controller 35. The DFM controller 35 increments the address data to the DFM 16 to write therein the data from the failure accumulator (FA) 31 or 32 through the multiplexer 34.

Figure 9:
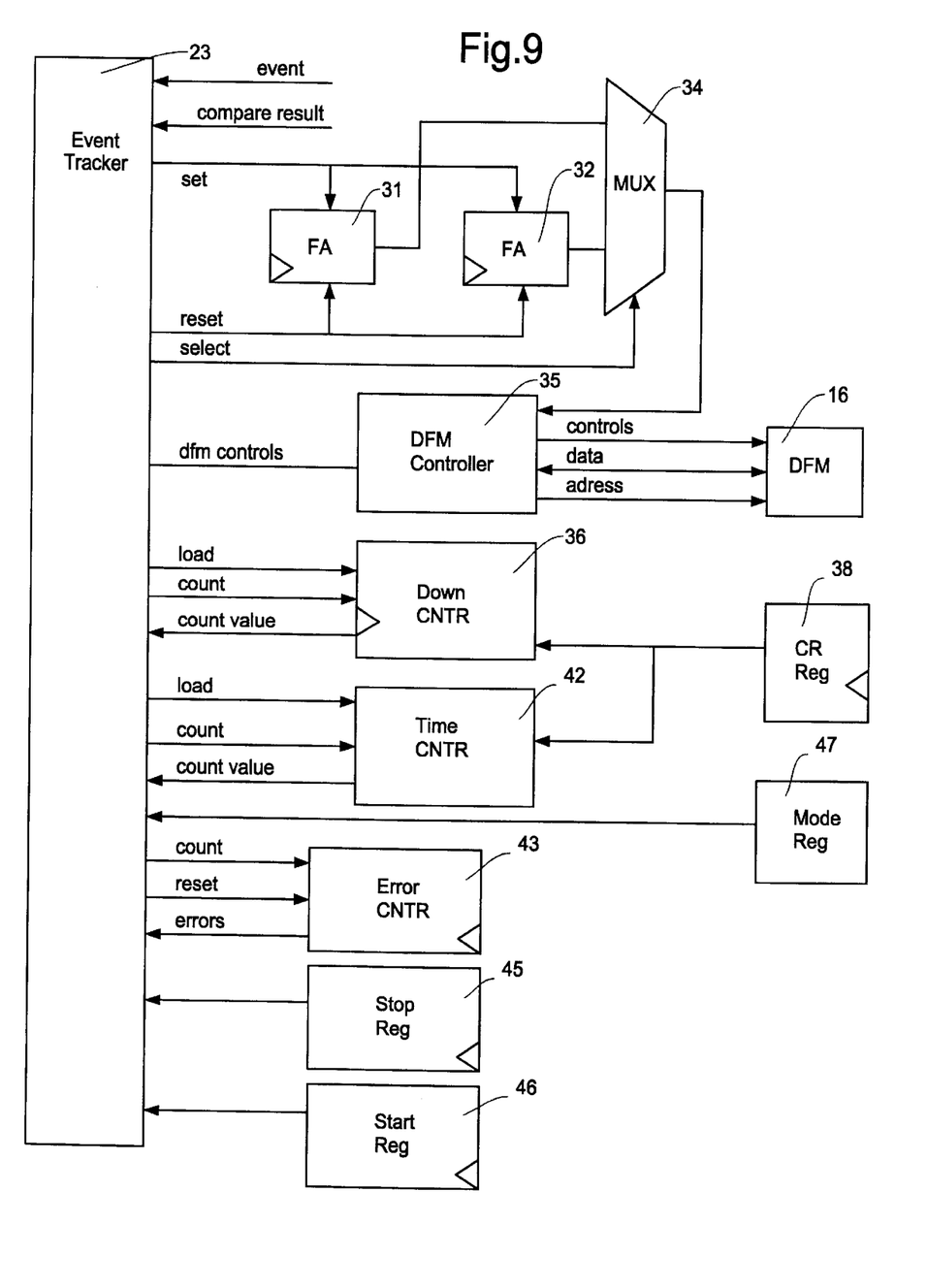
FIG. 9 is a block diagram showing an example of structure in the DFM (data failure memory) control logic and event tracker having both the event compaction function of the first embodiment and the time compaction function of the second embodiment to be used in the semiconductor test system of the present invention.

FIG. 9 is a block diagram showing an example of structure in the DFM (data failure memory) control logic having both the event compaction of the first embodiment and the time compaction of the second embodiment to be used in the semiconductor test system of the present invention. FIG. 9 includes both the down counter 36 to count the number of events and the time counter 42 to measure the time length of the test pattern. The example of FIG. 9 further includes a mode register 47 to select the event compaction mode or time compaction mode.

Preferably, the example of FIG. 9 includes an error counter 43 for counting the number of failure data such as in the second test operation. This error counter 43 is useful for terminating the overall test procedure when the number of errors reaches a predetermined level, thereby saving a test time in testing a defective device. The example of FIG. 9 further includes a stop register 45 and a start register 46 to specify a desired range of test pattern.

According to the present invention, the semiconductor test system is capable of collecting the failure information of the device under test in the data failure memory (DFM) of small capacity by using a compaction method. In one aspect, the failure data is captured in the DFM in an event compaction method in which a specified number of events produced by the pattern data from the pattern memory is assigned to a single address of the DFM. In another aspect, the failure data is captured in the DFM in a time compaction method in which a specified length of test pattern produced by the pattern data from the pattern memory is assigned to a single address of the DFM. In the case where a failure is detected in the compaction mode, a second test is performed for the range of test pattern, either in the number of test pattern of the time length of the pattern, with no compaction so that the test system can capture the failure data in a one-to-one relationship with a test signal.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A semiconductor test system for testing a semiconductor device under test (DUT), comprising:

a pattern memory for storing pattern data therein to produce a test pattern to be supplied to the DUT for testing the DUT;

means for evaluating an output signal of the DUT by comparing the output signal with an expected signal and producing failure data when there is a mismatch therebetween;

a data failure memory for storing the failure data caused by the mismatch between the output signal and the expected signal;

compaction means for assigning a plurality of series addresses of the pattern memory to a single address of the data failure memory in a first test operation so that failure data occurred in response to the test pattern produced by the pattern data within each group of the plurality of series addresses of the pattern memory is stored in a corresponding single address of the data failure memory in a predetermined compaction ratio, and means for executing a second test operation by the test pattern produced only by a group of plurality of addresses of the pattern memory for which the failure data is detected in the data failure memory without an address compaction between the pattern memory and the data failure memory and storing failure data occurred with respect to an address of the pattern memory in a corresponding address of the data failure memory.

2. A semiconductor test system as defined in claim 1, wherein the compaction ratio between the pattern memory and the data failure memory is determined by a number of events defined by the pattern data in the pattern memory and an address of the data failure memory.

3. A semiconductor test system as defined in claim 2, wherein the compaction means is comprised of:

a register for indicating the compaction ratio between the number of events in each group of the test pattern and the address of the data failure memory;

a failure accumulator for accumulating the failure data produced during the number of events specified by the compaction ratio;

a down counter for down counting the specified number of events received from the register every time when the event is produced based on the pattern data from the pattern memory;

a data failure memory controller for controlling write and read operations of the data failure memory; and an event tracker for controlling an overall operation in storing the failure data in the data failure memory by providing the failure data to the failure accumulator, monitoring count data of the down counter, and instructing the failure data memory controller to store the failure data from the failure accumulator every time when the count data of the down counter reaches zero.

4. A semiconductor test system as defined in claim 3, wherein the failure accumulator is formed of two accumulators to alternately store the failure data for each group of the specified number of events, and wherein the compaction means further includes a multiplexer for selecting one of the accumulators to send the failure data to the data failure memory based on a select signal from the event tracker.

5. A semiconductor test system as defined in claim 1, wherein the compaction ratio between the pattern memory and the data failure memory is determined by a time length of the test pattern produced by the pattern data in the pattern memory and an address of the data failure memory.

6. A semiconductor test system as defined in claim 5, wherein the compaction means is comprised of:

a register for indicating the compaction ratio between a time length of each group of the test pattern and the address of the data failure memory;

a failure accumulator for accumulating the failure data produced during the time length of each group of the test pattern specified by the compaction ratio;

a time counter for measuring a time length of the test pattern based on the specified compaction ratio received from the register by counting a number of clock pulses;

a data failure memory controller for controlling write and read operations of the data failure memory; and an event tracker for controlling an overall operation in storing the failure data in the data failure memory by providing the failure data to the failure accumulator, monitoring count data of the time counter, and instructing the failure data memory controller to store the failure data from the failure accumulator every time when the count data of the time counter reaches the time length specified by compaction ratio from the register.

7. A semiconductor test system as defined in claim 6, wherein the failure accumulator is formed of two accumulators to alternately store the failure data for each group of the specified time length of the test pattern, and wherein the compaction means further includes a multiplexer for selecting one of the accumulators to send the failure data to the data failure memory based on a select signal from the event tracker.

8. A semiconductor test system as defined in claim 1, wherein the compaction means is comprised of:

- a register for indicating the compaction ratio between either a number of events or a time length of each group of the test pattern and the address of the data failure memory;
- a failure accumulator for accumulating the failure data produced during the number of events or the time length of the test pattern specified by the compaction ratio;
- a down counter for down counting the specified number of events received from the register every time when the event is produced based on the pattern data from the pattern memory;
- a time counter for measuring a time length of the test pattern based on the specified time length received from the register every by counting a number of clock pulses;
- a mode register for indicating a selected compaction mode either an event number compaction or a time length compaction;
- a data failure memory controller for controlling write and read operations of the data failure memory; and
- an event tracker for controlling an overall operation in storing the failure data in the data failure memory by providing the failure data to the failure accumulator, monitoring count data of the down counter or time counter based on the selected compaction mode, and instructing the failure data memory controller to store the failure data from the failure accumulator every time when the count data of the down counter or time counter reaches the amount specified by the register.

9. A method of storing failure data detected when testing a semiconductor device under test (DUT), comprising the following steps of:

- reading pattern data stored in a pattern memory to produce a test pattern to be supplied to the DUT for testing the DUT;
- evaluating an output signal of the DUT by comparing the output signal with an expected signal and producing failure data when there is a mismatch therebtween;
- providing a data failure memory for storing the failure data caused by the mismatch between the output signal and the expected signal; and
- assigning a plurality of addresses of the pattern memory to a single address of the data failure memory in a first test operation so that failure data occurred in response to the test pattern based on each group of plurality of addresses of the pattern memory is stored in a single corresponding address of the data failure memory in a predetermined compaction ratio, and
- executing a second test operation by the test pattern produced only by a group of plurality of addresses of the pattern memory in which the failure data is detected without an address compaction between the pattern memory and the data failure memory.

* * * * *